(12) United States Patent
Kim

(10) Patent No.: US 11,354,062 B2
(45) Date of Patent: Jun. 7, 2022

(54) MEMORY SYSTEM AND OPERATION METHOD THEREOF

(71) Applicant: SK hynix Inc., Gyeonggi-do (KR)

(72) Inventor: Hyeon Cheol Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/941,134

(22) Filed: Jul. 28, 2020

(65) Prior Publication Data

US 2021/0149581 A1    May 20, 2021

(30) Foreign Application Priority Data

Nov. 18, 2019  (KR) ......................... 10-2019-0147473

(51) Int. Cl.
*G06F 3/06*  (2006.01)
*G06F 9/30*  (2018.01)

(52) U.S. Cl.
CPC .......... *G06F 3/0653* (2013.01); *G06F 3/0604* (2013.01); *G06F 3/0614* (2013.01); *G06F 3/0673* (2013.01); *G06F 9/30101* (2013.01)

(58) Field of Classification Search
CPC ..... G06F 3/0673; G06F 3/0614; G06F 3/0653
See application file for complete search history.

(56) References Cited

U.S. PATENT DOCUMENTS

2020/0065015 A1\* 2/2020 Lim ......................... H04L 1/24

FOREIGN PATENT DOCUMENTS

KR  10-0565212  3/2006
KR  10-1300036  8/2013

\* cited by examiner

*Primary Examiner* — Edward J Dudek, Jr.
(74) *Attorney, Agent, or Firm* — IP & T Group LLP

(57) ABSTRACT

A memory system includes: a memory device suitable for storing data; a controller suitable for controlling the memory device; an interface suitable for communication between a host and the controller; a register suitable for storing a parameter value set associated with a waveform and a magnitude of a signal provided by the interface to the host, wherein the controller is suitable for: performing signal transmission operations for candidates of the parameter value set, storing a new parameter value set, which is determined based on the responses of the signal transmission operations, in the register, and controlling the interface to transfer a new signal having adjusted waveform and magnitude to the host based on the new parameter value set.

11 Claims, 10 Drawing Sheets

FIG. 3B

| Symbol | Values | | Unit |
|---|---|---|---|
| | Min. | Max. | |
| M-TX Electrical | | | |
| $V_{DIF\_LA\_RT\_TX}$ | 160 | 240 | mV |
| $V_{DIF\_LA\_NT\_TX}$ | 320 | 480 | mV |
| $V_{DIF\_SA\_RT\_TX}$ | 100 | 130 | mV |
| $V_{DIF\_SA\_NT\_TX}$ | 200 | 260 | mV |
| $V_{CM\_LA\_TX}$ | 160 | 260 | mV |
| $V_{CM\_SA\_TX}$ | 80 | 190 | mV |

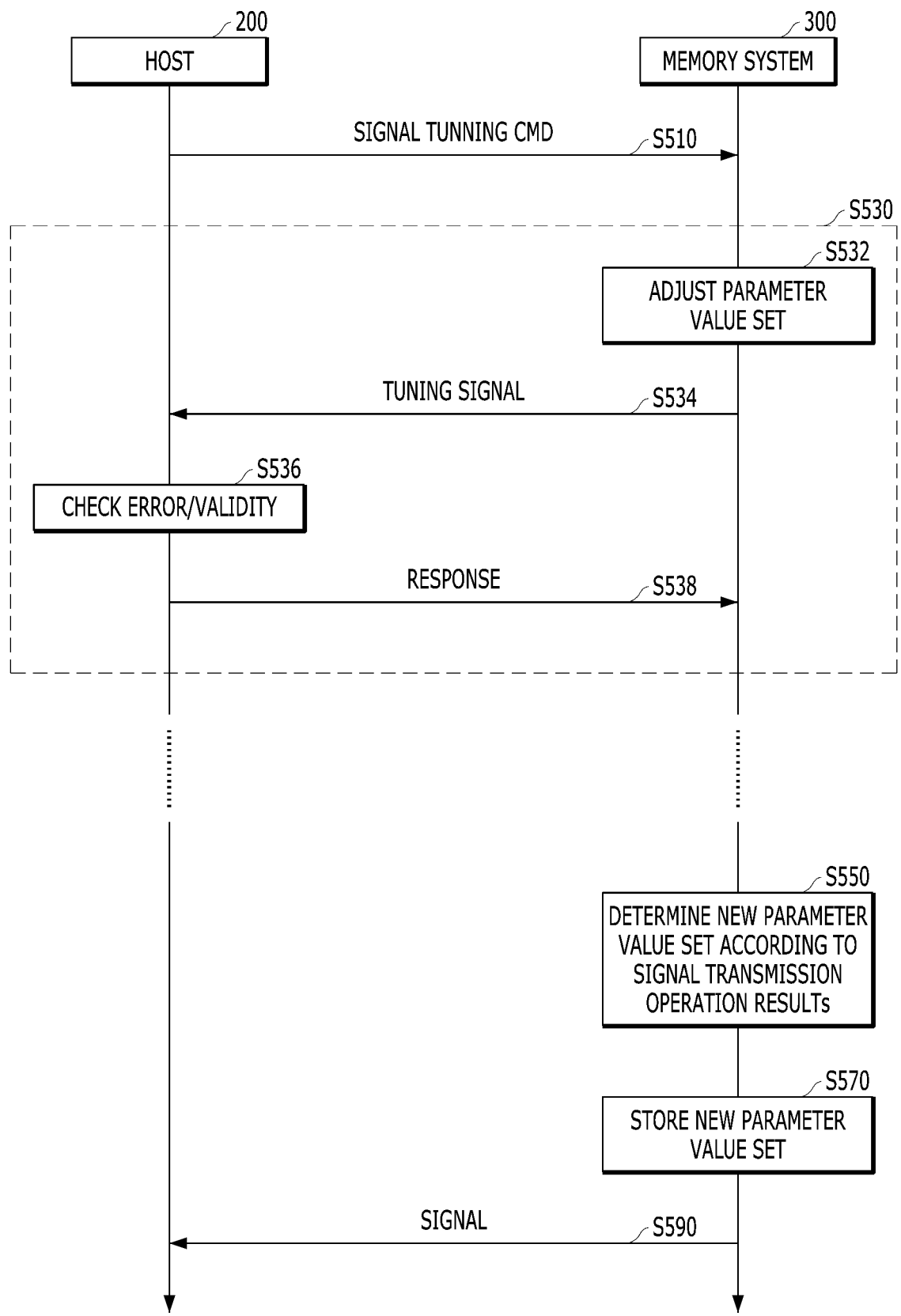

FIG. 6A

| TX Drive Level | | | Vp-p | |
|---|---|---|---|---|
| Dec | Bin | Hex | % of Vcca | (mV) |
| 0 | 0 | 0 | 25 | 218.8 |
| 1 | 1 | 1 | 27 | 239.9 |
| 2 | 10 | 2 | 30 | 261.1 |
| 3 | 11 | 3 | 32 | 282.3 |
| 4 | 100 | 4 | 35 | 303.4 |
| 5 | 101 | 5 | 37 | 324.6 |
| 6 | 110 | 6 | 40 | 345.8 |
| 7 | 111 | 7 | 42 | 366.9 |
| 8 | 1000 | 8 | 44 | 388.1 |
| 9 | 1001 | 9 | 47 | 409.3 |
| 10 | 1010 | A | 49 | 430.4 |
| 11 | 1011 | B | 52 | 451.6 |
| 12 | 1100 | C | 54 | 472.8 |
| 13 | 1101 | D | 56 | 494 |
| 14 | 1110 | E | 59 | 515.1 |
| 15 | 1111 | F | 61 | 536.3 |
| 16 | 10000 | 10 | 64 | 557.5 |
| 17 | 10001 | 11 | 66 | 578.6 |
| 18 | 10010 | 12 | 69 | 599.8 |
| 19 | 10011 | 13 | 71 | 621 |
| 20 | 10100 | 14 | 73 | 642.1 |
| 21 | 10101 | 15 | 76 | 663.3 |
| 22 | 10110 | 16 | 78 | 684.5 |
| 23 | 10111 | 17 | 81 | 705.6 |
| 24 | 11000 | 18 | 83 | 726.8 |
| 25 | 11001 | 19 | 85 | 748 |
| 26 | 11010 | 1A | 88 | 769.2 |
| 27 | 11011 | 1B | 90 | 790.3 |
| 28 | 11100 | 1C | 93 | 811.5 |
| 29 | 11101 | 1D | 95 | 832.7 |
| 30 | 11110 | 1E | 98 | 853.8 |
| 31 | 11111 | 1F | 100 | 875 |

FIG. 6B

| TX_PRE_EMPH | | | Pre-emphasis (dB) | Vc/Vb |
|---|---|---|---|---|
| Dec | Bin | Hex | dB | % |
| 0 | 00000 | 0 | 0.0 | 100 |
| 1 | 00001 | 1 | 0.1 | 101 |
| 2 | 00010 | 2 | 0.3 | 104 |
| 3 | 00011 | 3 | 0.5 | 106 |
| 4 | 00100 | 4 | 0.7 | 108 |
| 5 | 00101 | 5 | 0.9 | 111 |
| 6 | 00110 | 6 | 1.1 | 114 |
| 7 | 00111 | 7 | 1.3 | 116 |
| 8 | 01000 | 8 | 1.5 | 119 |
| 9 | 01001 | 9 | 1.7 | 122 |
| 10 | 01010 | A | 1.9 | 124 |

| TX_DE_EMPH | | | De-emphasis (dB) | Vb/Va |
|---|---|---|---|---|
| Dec | Bin | Hex | dB | % |
| 0 | 00000 | 0 | 0.0 | 100 |
| 1 | 00001 | 1 | -0.2 | 98 |
| 2 | 00010 | 2 | -0.4 | 95 |
| 3 | 00011 | 3 | -0.6 | 93 |
| 4 | 00100 | 4 | -0.9 | 91 |
| 5 | 00101 | 5 | -1.1 | 88 |

MEMORY SYSTEM AND OPERATION METHOD THEREOF

CROSS-REFERENCE TO RELATED APPLICATION

The present application claims priority of Korean Patent Application No. 10-2019-0147473, filed on Nov. 18, 2019, which is incorporated herein by reference in its entirety.

BACKGROUND

1. Field

Various embodiments of the present invention relate to a memory system.

2. Description of the Related Art

Recently, the paradigm of the computer environment has shifted to ubiquitous computing, which enables the use of computer systems anytime and anywhere. As a result, the use of portable electronic devices, such as mobile phones, digital cameras, laptop computers, and the like, has rapidly increased. Such portable electronic devices generally use a memory system including a memory device, that is, a data storage device. The data storage device is used as a main memory device or an auxiliary memory device of a portable electronic device.

The data storage device using a memory device has many advantages because it does not a mechanical driving part. It has excellent stability and durability as well as a fast data access rate with low power consumption. Examples of a memory systems, i.e., data storage devices, having such advantages include a Universal Serial Bus (USB) memory device, a memory card of diverse interfaces, a Solid State Drive (SSD), and the like.

SUMMARY

Embodiments of the present invention are directed to a memory system secured with reliability of communication between a host and a memory system regardless of a mounting environment.

In accordance with an embodiment of the present invention, a memory system includes: a memory device suitable for storing data; a controller suitable for controlling the memory device; an interface suitable for communication between a host and the controller; a register suitable for storing a parameter value set associated with a waveform and a magnitude of a signal provided by the interface to the host, wherein the controller is suitable for: performing operations for candidates of the parameter value set, each of the operation includes: controlling the interface to transfer a first signal, a magnitude and waveform of which are determined based on the candidate of the parameter value set, to the host, and receiving, from the host, a response indicating whether or not the first signal was recognized as valid at the host, storing a new parameter value set, which is determined based on the responses of the operations, in the register, and controlling the interface to transfer a new signal having adjusted waveform and magnitude to the host based on the new parameter value set.

In accordance with another embodiment of the present invention, a method for operating a memory system includes: performing, for candidates of a parameter value set, operations of: transferring, to the host, a first signal, the magnitude and waveform of which are determined based on one among the candidates of the parameter value set, and receiving, from the host, a response indicating whether or not the first signal was recognized as valid at the host; storing a new parameter value set, which is determined based on results of the operations, in the register; and transferring a new signal having adjusted waveform and magnitude to the host based on the new parameter value set.

In accordance with still another embodiment of the present invention, an operating method of a controller, the operating method includes: heuristically obtaining, by providing a first signal to an external device and receiving a response from the external device, one or more optimal sets of parameters for a communication signal; and communicating with the external device through the communication signal based on at least one of the one or more optimal sets of parameters to control a memory device to perform an operation.

BRIEF DESCRIPTION OF THE DRAWINGS

FIGS. 3A to 3C show a drive level parameter, an emphasis operation, and an emphasis parameter.

FIG. 5 is a flowchart describing an operation of a memory system in accordance with an embodiment of the present invention.

FIGS. 6A to 6B are tables showing combinations of parameter values.

DETAILED DESCRIPTION

Figure 1:
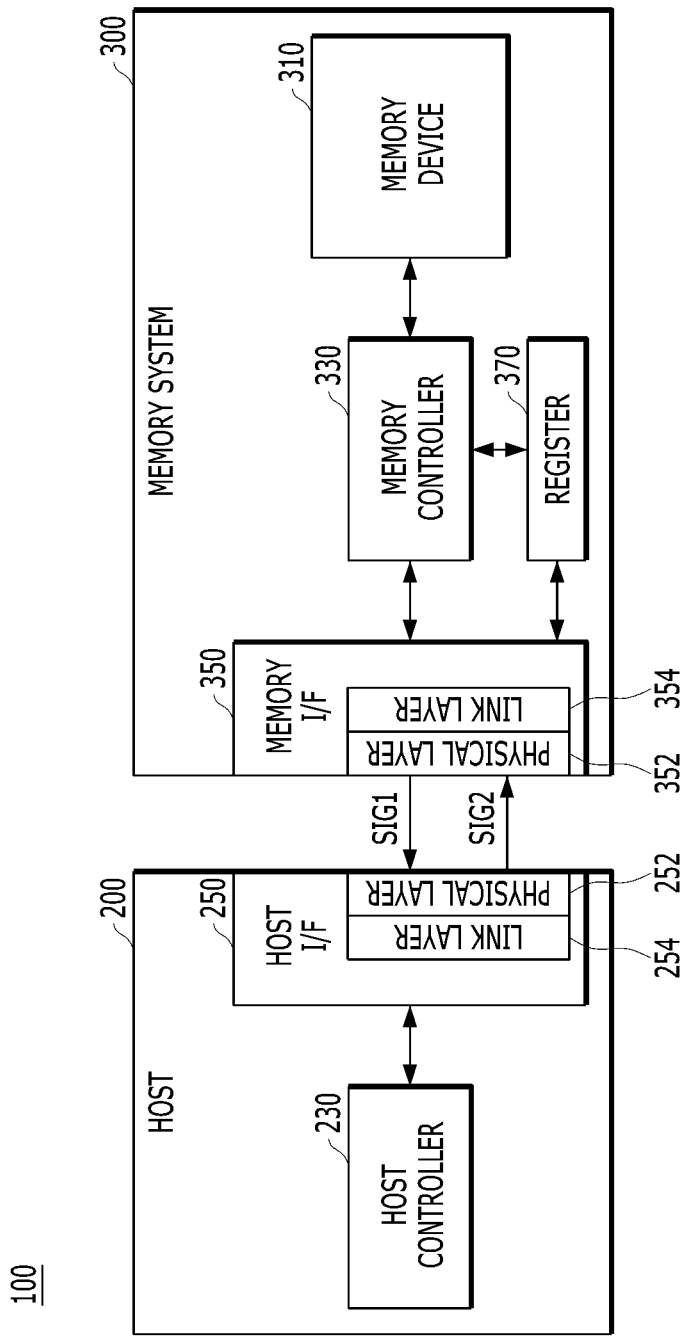
FIG. 1 is a block diagram illustrating a data processing system including a memory system in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" and the like is not necessarily to only one embodiment, and different references to any such phrase are not necessarily to the same embodiment(s).

Hereinafter, embodiments of the present invention are described in detail with reference to the drawings.

FIG. 1 is a block diagram illustrating a data processing system 100 including a memory system 300 in accordance with an embodiment of the present invention.

Referring to FIG. 1, the data processing system 100 may include a host 200 and a memory system 300.

The host 200 may include any of various portable electronic devices such as mobile phones, MP3 players, laptop computers and the like, or electronic devices such as desktop computers, game consoles, TVs, projectors and the like.

The host 200 may include at least one operating system (OS). The operating system may manage and control the general functions and operations of the host 200, and provide an interaction between the host 200 and a user who uses the data processing system 100 or the memory system 300. The operating system may support functions and operations corresponding to a user's purpose and a usage, and the operating system may be divided into a general operating system and a mobile operating system according to the mobility of the host 200. The general operating system of the operating system may be also divided into a personal operating system and an entrepreneurial operating system according to a user service environment.

The memory system 300 may operate to store data of the host 200 in response to a request of the host 200. For example, the memory system 110 may be an interface that operates according to the MIPI M-PHY protocol, such as Universal Flash Storage (UFS) and Universal Storage Bus (USB), and the memory system 110 may communicate with the host 200 to store the data of the host 200.

The host 200 may provide the memory system 300 with various commands. The command may include a read command and a write command. The memory system 300 may be coupled to the host 200.

When the command of the host 200 is a write command, the memory system 300 may store data received from the host 200. When the command of the host 200 is a read command, the memory system 300 may be provide the host 200 with the data stored therein.

The host 200 may include a host controller 230 and a host interface 250.

The host controller 230 may output various signals for controlling the host 200. For example, the host controller 230 may generate a read command for reading data from the memory system 300 and provide the generated read command to the memory system 300.

The host interface 250 may exchange signals between the host controller 230 and the memory system 300. The host interface 250 may be coupled to the memory system 300 through a standard interface.

The host interface 250 may include a host physical layer 252 and a host link layer 254.

The host physical layer 252 may provide an electrical signal to the memory system 300 and receive an electrical signal from the memory system 300. According to an embodiment of the present invention, the host physical layer 252 may support the Mobile Industry Processor Interface (MIPI) M-PHY protocol.

The host link layer 254 may be a layer over the host physical layer 252. The host link layer 254 may convert a message from the host controller 230 into electrical signals, provide the electrical signals to the host physical layer 252, determines whether or not the electrical signals inputted from the host physical layer 252 are valid, and provides a message to the host controller 230. According to an embodiment of the present invention, the host link layer 254 may support the MIPI UNIPRO protocol.

The memory system 300 may include a memory device 310, a memory controller 330, a memory interface 350, and a register 370.

The memory device 310 may store data for the host 200. The memory device 310 may be a non-volatile memory device and may retain the stored data even when power is not supplied. The memory device 310 may store the data provided from the host 200 through a program operation, and may provide the data stored in the memory device 310 to the host 200 through a read operation. According to an embodiment of the present invention, the memory device 310 may be a flash memory. The flash memory may have a three-dimensional stack structure.

The memory controller 330 may control overall operation of the memory system 300.

For example, the memory controller 330 may perform an operation requested by the host 200 through a processor which is realized as a microprocessor or a Central Processing Unit (CPU). The memory controller 330 may perform a foreground operation as a command operation corresponding to a command received from the host 200.

The memory controller 330 may perform a background operation on the memory device 310. For example, the background operation for the memory device 310 may include a garbage collection (GC) operation, a wear leveling (WL) operation, a map flush operation, a bad block management operation and the like.

The memory interface 350 may exchange signals between the host 200 and the memory controller 330. The memory interface 350 may be coupled to the host interface 250 through a standard interface.

The memory interface 350 may include a memory physical layer 352 and a memory link layer 354. The memory physical layer 352 and the memory link layer 354 may be paired with the host physical layer 252 and the host link layer 254. For example, the memory physical layer 352 may support the MIPI M-PHY protocol, and the memory link layer 354 may support the MIPI UNIPRO protocol. A transferor (not shown) of the host physical layer 252 may be coupled to a receiver (not shown) of the memory physical layer 352. A receiver (not shown) of the host physical layer 252 may be coupled to a transferor (not shown) of the memory physical layer 352.

A channel formed for transferring and receiving signals between the host 200 and the memory system 300 may be referred to as a lane. A pair of a transferor and a receiver of the host physical layer 252 may be coupled to a pair of a receiver and a transferor of the memory physical layer 352 to form a lane. FIG. 1 illustrates a first signal SIG1 transferred from the transferor of the memory physical layer 352 to the receiver of the host physical layer 252 and a second signal SIG2 transferred from the transferor of the host physical layer 252 to the receiver of the memory physical layer 352. According to an embodiment of the present invention, the host 200 and the memory system 300 may be coupled through one or more lanes.

The register 370 may store data for determining an operation mode of the memory system 300. For example, the register 370 may store a parameter vale set that determine the magnitude and waveform of an electrical signal transferred from the memory physical layer 352 to the host physical layer 252.

The constituent elements of the memory system 300, such as the memory device 310, the controller 330, the memory interface 350, and the register 370, may be integrated into one semiconductor device. Also, the constituent elements of the memory system 300 may be integrated into one semiconductor device to form a memory card, such as a UFS storage device.

An example of a parameter that determines the magnitude of an electrical signal may be a drive level parameter that determines a peak-to-peak voltage of an electrical signal, and an example of a parameter that determines the waveform of an electrical signal may be an emphasis parameter that determines the extent of an emphasis operation. The drive level parameter, the emphasis operation, and the emphasis parameter are described below with reference to FIGS. 3A to 3C.

A drive level parameter value and an emphasis parameter value of the electrical signal may be determined while the memory system 300 is fabricated, stored in the memory device 310, and then loaded and used in the register 370 during the operation of the memory system 300.

The host physical layer 252 may receive a normal i.e., valid, electrical signal when the electrical signal received from the memory physical layer 352 has a noise margin within a set range. Whether or not the host physical layer 252 can receive a normal electrical signal from the memory physical layer 352 may be determined not only based on the magnitude and waveform of the electrical signal when the electrical signal is transferred but also based on the environment of the lane formed between the host physical layer 252 and the memory physical layer 352.

The environment of the lane may vary depending on the mounting environment of the host 200 and the memory system 300. For example, when the host 200 and the memory system 300 are mounted on a smart phone, the arrangement of the host 200 and the memory system 300 on a circuit may be different depending on which type of a smart phone on which they are mounted.

As the demand for fast data input and output increases, communication between the host interface 250 and the memory interface 350 is also accelerated. As the data transmission rate increases, the electrical signals transferred from the memory physical layer 352 may be more affected by the mounting environment. Even though the memory physical layer 352 transfers the same electrical signal, the noise margin of the electrical signal received by the host physical layer 252 may vary greatly according to the mounting environment.

When the memory system 300 is fabricated, not all types of mounting environments of the memory system 300 may be considered. When the memory physical layer 352 transfers an electrical signal by using the size determined during the fabrication of the memory system 300 and the value of the emphasis parameter, the host 200 may not receive a normal signal of the memory system 300 depending on the mounting environment. Therefore, the reliability of the memory system 300 may be deteriorated.

Accordingly, a memory system 300 capable of setting the values of the drive level parameter and the emphasis parameter according to the mounting environment is required.

According to an embodiment of the present invention, the memory controller 330 may repeatedly perform a signal transmission operation onto a plurality of candidates of a parameter value set in response to a command from the host 200 and determine the new parameter value set based on the signal transmission operation result. A candidate of a parameter value may include the drive level parameter value and the emphasis parameter value.

To be specific, the memory controller 330 may control the memory interface 350 to transfer a tuning signal to the host interface 250 and perform a signal transmission operation of receiving a response that represents whether or not the tuning signal received from the host interface 250 is normal, i.e., valid. The memory controller 330 may perform the signal transmission operation a plurality of times by varying the parameter value set among the candidates of the parameter value set, and temporarily store the result of each signal transmission operation in an internal memory. The memory controller 330 may determine the new parameter value set based on the candidates of the parameter value set when the signal transmission is successful in the signal transmission operation. The new parameter value set may be stored in the register 370. The memory physical layer 352 may transfer a signal to the host physical layer 252 based on the new parameter value set.

The signal transmission operation may be performed in the mounting environment of the memory system 300. When the new parameter value set are determined by the signal transmission operation, the memory interface 350 may transfer a signal to the host interface 250 by using the parameter value set appropriate for the mounting environment. Therefore, the reliability of signal transmission between the host 200 and the memory system 300 may be secured regardless of the mounting environment of the host 200 and the memory system 300.

Hereinafter, the memory system 300 and a method for operating the memory system 300 in accordance with an embodiment of the present invention are described in detail.

Figure 2:
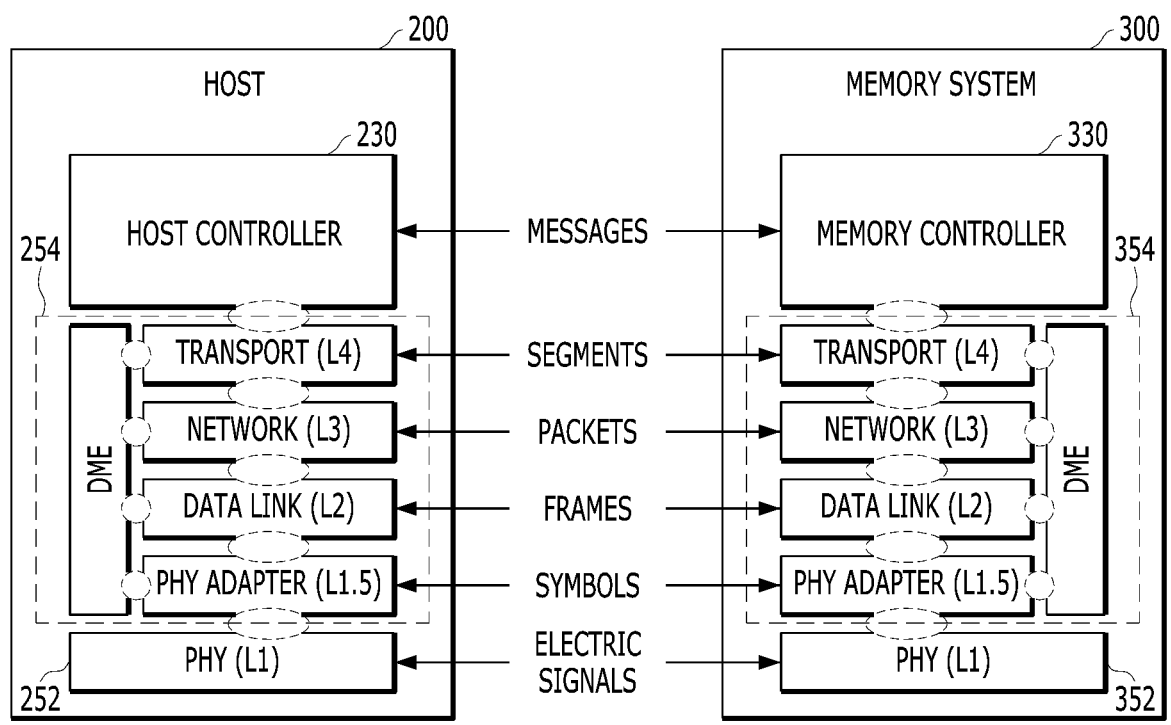
FIG. 2 is a block diagram illustrating an example of a host interface and a memory interface.

FIG. 2 is a block diagram illustrating an example of the host interface 250 and the memory interface 350.

FIG. 2 shows a data processing system 100 that includes the host 200 and the memory system 300. The data processing system 100 of FIG. 2 may correspond to the data processing system 100 described with reference to FIG. 1.

The host controller 230 and the memory controller 330 may provide an abstracted application layer. The host controller 230 and the memory controller 330 may exchange a message (MESSAGE) through the host interface 250 and the memory interface 350.

Referring to FIG. 1, the host interface 250 may include a host physical layer 252 and a host link layer 254, and the memory interface 350 may include a memory physical layer 352 and a memory link layer 354. In FIG. 2, the host physical layer 252 and the memory physical layer 352 may be collectively called a physical layer, and the host link layer 254 and the memory link layer 354 may be collectively called a link layer.

Referring to FIG. 1, the link layer may support the MIPI UNIPRO, and the physical layer may support the MIPI M-PHY.

The physical layer may output or receive electrical signals according to a standard. According to an embodiment of the present invention, the physical layer may output electrical signals of error correction encoded data. When the physical layer receives the electrical signals, the physical layer may detect and correct an error by decoding the data corresponding to the electrical signals. When the noise margin of the signals received in the physical layer is not sufficient, an error may be included in the data bits corresponding to the received signals, and the physical layer may detect and correct the error.

The link layer may convert electrical signals based on a standard.

The link layer may include a physical adapter layer L1.5 (PHY ADAPTER), a data link layer L2 (DATA LINK), a network layer L3 (NETWORK), a transport layer L4 (TRANSPORT), and a Device Management Entity (DME) for controlling the layers L1.5 to L4.

The layers L1.5 to L4 included in the link layer may sequentially convert a message from the controller into segments, packets, frames, and symbols and provide them to the physical layer. The layers L1.5 to L4 may sequentially convert electrical signals received in the physical layer into symbols, frames, packets, and segments and provide them to the controller. The layers L1.5 to L4 may determine whether or not the converted signals are valid while converting the electrical signals into symbols, frames, packets, and segments. For example, when the converted signals do not fit a set format that may be predetermined, the layers L1.5 to L4 may determine that the converted signals are not valid.

Through the above-described signal type conversion operation between the layers, a header may be added to or removed from a signal as the signal passes through each layer. Hereinafter, a signal may be referred to by the same name even after conversion(s).

Figure 3A:
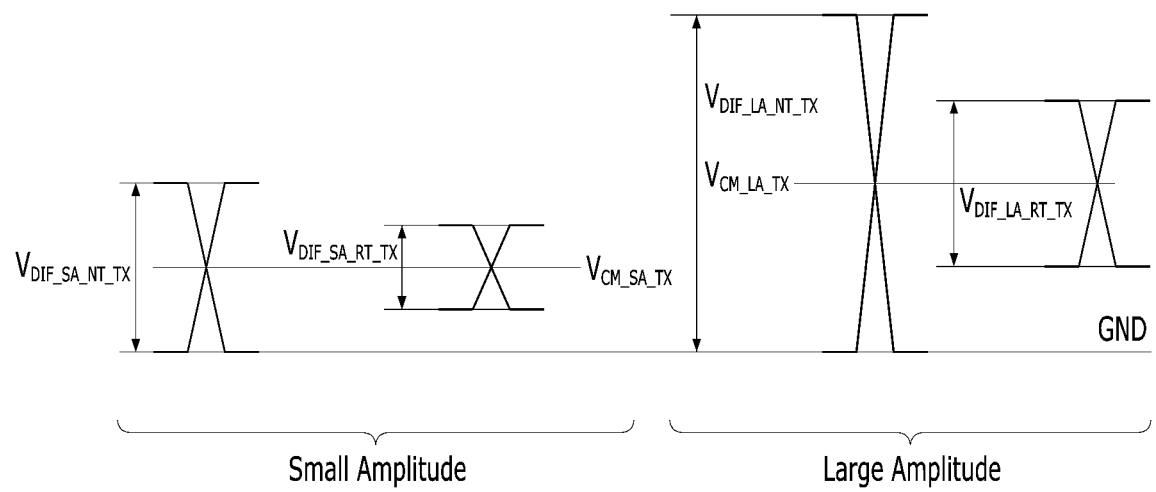
Figure 3C:
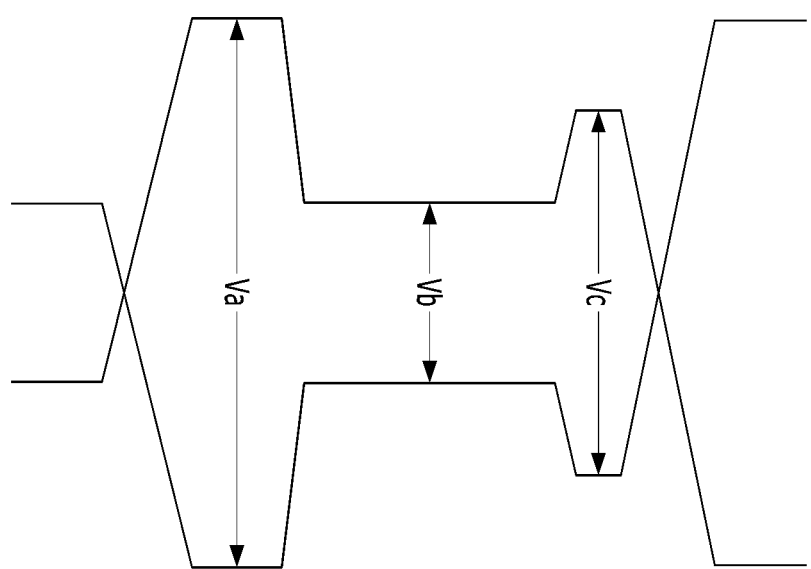

FIGS. 3A to 3C show a drive level parameter, an emphasis operation, and an emphasis parameter.

FIG. 3A illustrates the potential of a signal outputted from the memory physical layer 352.

The memory physical layer 352 may output differential signals in which two signals swing around a common mode voltage in order to cancel the noise of signals.

The M-PHY protocol may provide diverse options of signals outputted from the memory physical layer 352.

The memory physical layer 352 may output the differential signals in a large amplitude (LA) mode or a small amplitude (SA) mode according to the option provided by the protocol. The memory physical layer 352 may use a termination resistor for impedance matching of lanes, and may activate or deactivate the termination resistor according to the option provided by the protocol. In which mode the memory physical layer 352 is to be operated and whether or not the termination resistor is to be activated may be determined by the host 200. For example, when the memory system 300 is to be operated in a high-speed mode, the host 200 may provide a command to the memory system 300 so that the memory physical layer 352 activates and operates the termination resistor in a small amplitude mode.

FIG. 3A shows the potential of the differential signal according to each option. VCM_SA_TX in FIG. 3A may represent a common mode voltage of the differential signal in the small amplitude mode, and VCM_LA_TX may represent a common mode voltage of the differential signal in the large amplitude mode. VDIF_SA_NT_TX may represent a swing width of the differential signal in the small amplitude mode when the termination resistor is deactivated, and VDIF_SA_RT_TX may represent a swing width of the differential signal in the small amplitude mode when the termination resistor is activated. VDIF_LA_NT_TX may represent a swing width of the differential signal in the large amplitude mode when the termination resistor is deactivated, and VDIF_LA_RT_TX may represent a swing width of the differential signal in the large amplitude mode when the termination resistor is activated.

FIG. 3B illustrates the ranges of the common voltage and swing width for each mode.

The M-PHY protocol may provide the ranges of the common voltage and swing width for each mode.

VDIF_LA_RT_TX, VDIF_LA_NT_TX, VDIF_SA_RT_TX, VDIF_SA_NT_TX, VCM_LA_TX, and VCM_SA_TX in the table of FIG. 3B may be the same as those described with reference to FIG. 3A.

For example, when the memory physical layer 352 activates and operates the termination resistor in a large amplitude mode, the common mode voltage may be determined as a voltage between approximately 160 mV and approximately 260 mV, and the swing width may be determined as a voltage between approximately 320 mV and approximately 480 mV. Since the peak-to-peak amplitude of the differential signal is determined by the difference between two differential signals, the peak-to-peak amplitude of the differential signal having a swing width of a value between approximately 320 mV and approximately 480 mV may be between approximately 640 mV and approximately 960 mV.

In what amplitude the memory physical layer 352 is to transfer an output signal in a range of a set peak-to-peak amplitude may be determined according to the value of the drive level parameter of the register 370, which is described with reference to FIG. 1. Non-limiting examples of the value of the drive level parameter are described below with reference to FIG. 6A.

Meanwhile, an Inter-Symbol Interference (ISI) phenomenon may occur in the output signal from the memory physical layer 352, and a high frequency component of the output signal may be attenuated due to the ISI phenomenon, thereby causing distortion in the waveform of the signal. The memory physical layer 352 may perform an emphasis operation to increase the swing width of a portion of a signal where the signal is attenuated so that the signal received by the receiver is normal.

FIG. 3C shows a waveform of a signal according to an emphasis operation.

When the memory physical layer 352 performs an emphasis operation, the output signal may have a waveform in which the voltage level of a section where a data transitions is higher than the voltage level of a section where the data is maintained. Hereinafter, this data waveform may be referred to as an emphasis waveform. By this emphasis waveform, the ISI of the output signal according to the above-described channel bandwidth limitation may be improved.

As for the method for generating an emphasis waveform of an output signal according to an emphasis operation, there are a pre-emphasis method and a de-emphasis method.

The pre-emphasis method generates an emphasis waveform by raising the voltage level of the section where a data transitions to be higher than the voltage level of the section where the data is maintained, based on the voltage level of the section where the data are maintained.

The de-emphasis method generates an emphasis waveform by lowering the voltage level of the section where a data is maintained to be lower than the voltage level of the section where the data transitions, based on the voltage level of the section where the data transitions.

FIG. 3C illustrates an emphasis waveform of an output signal when both of the pre-emphasis method and the de-emphasis method are applied. Va may represent a swing width of a section immediately after a data transitions, and Vb may represent a swing width of a section where the data is maintained, and Vc may represent a swing width of a section immediately before the data transitions.

In the example of FIG. 3C, the de-emphasis method for lowering Vb to be lower than Va based on Va may be applied. The de-emphasis ratio of Vb and Va may correspond to $20 \log(Vb/Va)[dB]$. Also, the pre-emphasis method for raising Vc to be higher than Vb based on Vb may be applied. The pre-emphasis ratio of Vc and Vb may correspond to $20 \log(Vb/Va)[dB]$. In the example of FIG. 3C, Vb and Vc may be determined based on the reference swing width Va, the de-emphasis ratio, and the pre-emphasis ratio.

The emphasis waveform may be determined based on an emphasis parameter of the register 370. According to an embodiment of the present invention, the emphasis parameter may include a de-emphasis parameter and a pre-emphasis parameter.

The memory physical layer 352 may set Va as the swing width determined based on the drive level parameter of the register 370, and determine Vb and Vc based on the de-emphasis parameter and the pre-emphasis parameter.

The memory physical layer 352 may provide signals of different magnitudes and waveforms to the host physical layer 252 based on the values of the drive level parameter and the emphasis parameter. The host physical layer 252 may receive a signal having a different noise margin based on the parameter values and the mounting environment of the memory system 300.

Figure 4A:
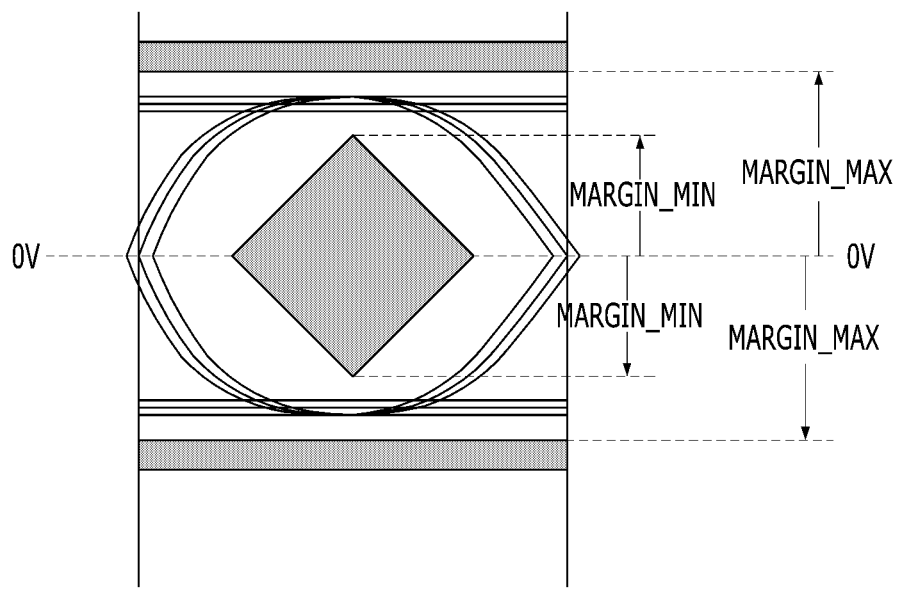
FIGS. 4A and 4B are eye diagrams illustrating a signal received by a host physical layer.
Figure 4B:
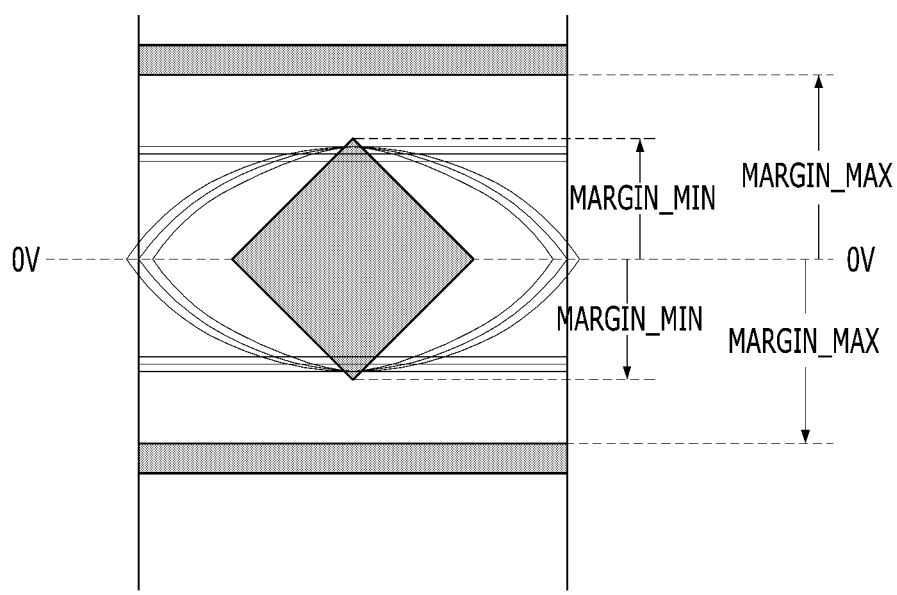

FIGS. 4A and 4B are eye diagrams illustrating a signal received by the host physical layer 252.

Normally, the host physical layer 252 may only receive a signal having a noise margin within a set range. When the noise margin of the received signal is less than the minimum noise margin MARGIN_MIN or exceeds the maximum noise margin MARGIN_MAX, the host physical layer 252 may not receive the signal.

The shaded portions of FIGS. 4A and 4B may represent eye mask regions.

FIG. 4A illustrates a case where the noise margin of a received signal falls within a set range. When the noise margin of the received signal is within a set range, the signal does not break into an eye mask area in the eye diagram, and the host physical layer 252 may receive the signal.

FIG. 4B illustrates a case where the noise margin of a received signal does not fall in the set range. When the noise margin of the received signal is out of the set range, the signal may break into the eye mask area in the eye diagram, and the host physical layer 252 may not receive the signal.

In order to prevent a problem that the host physical layer 252 does not receive a normal, i.e., valid, signal according to the mounting environment of the memory system 300, the host 200 may provide a signal tuning command to the memory system 300. The memory system 300 may output a normal signal that the host physical layer 252 can receive by changing the drive level parameter and the emphasis parameter of the register 370 in response to the signal tuning command.

FIG. 5 is a flowchart describing an operation of the memory system 300 in accordance with an embodiment of the present invention.

In step S510, the host 200 may provide a signal tuning command to the memory system 300 to optimize a parameter value set of the memory system 300 to the mounting environment. The parameter value set may include the drive level parameter value and the emphasis parameter value.

For example, the host 200 may provide a signal tuning command to the memory system 300 when the data processing system 100 is initially booted up.

In step S530, the memory system 300 may perform a signal transmission operation to tune the parameter value set associated with the signal.

The test operation may include the operations of steps S532 to S538.

In step S532, the memory controller 330 may adjust the parameter value set. In other words, the memory controller 330 may select one among candidates of the parameter value set. A candidate of the parameter value set may include a candidate of the drive level parameter value and a candidate of emphasis parameter value.

In step S534, the memory controller 330 may control the memory physical layer 532 to provide a tuning signal to the host 200.

The magnitude and waveform of the tuning signal may be determined according to the selected candidate of the parameter value set.

In step S536, the host interface 250 may receive the tuning signal and check the validity of the tuning signal or whether or not the tuning signal has an error.

When the selected parameter value set are not suitable for the mounting environment, the host interface 250 may not receive a normal tuning signal. The non-normal signal received by the host interface 250 may be a bit-flipped signal, and it may determine the bit-flipped signal as an error signal (i.e., having one or more bit errors) or an invalid signal.

According to an embodiment of the present invention, the tuning signal may be an error correction encoded signal, and the host physical layer 252 may check whether or not the tuning signal has an error through an error correction decoding.

According to an embodiment of the present invention, each of the layers included in the host link layer 254 may determine that the tuning signal is invalid when the tuning signal does not follow a set pattern.

In step S538, the host interface 250 may provide a response, representing whether or not a normal tuning signal has been received, to the memory system 300.

For example, the host interface 250 may provide a response indicating that a normal tuning signal has been received, when the tuning signal has no bit error or the tuning signal is determined to be a valid signal. For example, when the tuning signal has a bit error or the tuning signal is determined to be an invalid signal, the host interface 250 may provide a response indicating that the received tuning signal is abnormal.

The memory system 300 may repeatedly perform the signal transmission operation of the step S530 for a plurality of combinations of the parameter values.

FIGS. 6A to 6B are tables showing the parameter value set.

FIG. 6A presents an amplitude of a signal based on the drive level parameter value.

In FIG. 6A, the candidates of the drive level parameter value are represented in the forms of decimal numbers Dec, binary numbers Bin, and hexadecimal numbers Hex. In the example of FIG. 6A, there are a total of 32 drive level parameter values. The amplitude of the signal may be expressed by a peak-to-peak amplitude. The peak-to-peak amplitude of the signal according to the drive level parameter value may be expressed in the form of the ratio of the maximum amplitude that may be outputted from the memory physical layer 352 (% of Vcca) and the actual amplitude value (mV).

The drive level parameter value may be selected according to the option provided by the protocol of the memory system 300. The protocol option of the memory system 300 may be selected in advance by the host 200.

For example, when the memory system 300 operates by deactivating the termination resistor in the large amplitude mode, which is described earlier with reference to FIG. 3A, the swing width of the output signal may fall in the range of approximately 320 mV to approximately 480 mV, and the peak-to-peak amplitude of the output signal may fall in the range of approximately 640 mV to approximately 960 mV. In the example of FIG. 6A, the memory system 300 may select the drive level parameter value in the range of 21 to 31 to satisfy the range condition of the peak-to-peak amplitude.

FIG. 6B presents the extent that the waveform of a signal changes according to the emphasis parameter value. According to an embodiment of the present invention, the emphasis parameter may include a pre-emphasis parameter and a de-emphasis parameter.

In FIG. 6B, the candidates of the pre-emphasis parameter values and the candidates of the de-emphasis parameter values may be represented in the form of decimal numbers Dec, binary numbers Bin, and hexadecimal numbers Hex.

The upper graph of FIG. 6B shows the ratio of a signal amplitude in a section Vc immediately before a data transitions to a signal amplitude in a section Vb in which the data is maintained according to the pre-emphasis parameter value in the form of decibel (dB) and percent (%). The memory system 300 may select the pre-emphasis parameter value from the range of 0 to 10.

The lower graph of FIG. 6B shows the ratio of a signal amplitude in a section Vb in which the data is maintained to a section Va immediately after the data transitions according to the de-emphasis parameter value in the form of decibel (dB) and percent (%). The memory system 300 may select the de-emphasis parameter value from the range of 0 to 5.

When the memory system 300 operates by deactivating the termination resistor in the large amplitude mode, the memory controller 330 may repeatedly perform the signal transmission operation by selecting the drive level parameter value, the pre-emphasis parameter value, and the de-emphasis parameter value among all or some combinations of a total of 726 combinations (726=11×11×6) of (21, 0, 0) to (31, 10, 5).

According to an embodiment of the present invention, the memory physical layer 352 may transfer a tuning signal that is not error-correction-encoded to reduce the amount of computation and improve the sensitivity to errors in the host link layer 254. In this way, it is possible to quickly perform a plurality of signal transmission operations.

Referring back to FIG. 5, in step S550, the memory controller 330 may determine an intermediate parameter value set among the candidates of the parameter value set corresponding to a successful result of the signal transmission operation as the new parameter value set. For example, when the minimum value of the pre-emphasis parameter is 6 and the maximum value of the pre-emphasis parameter is 10 in the candidates of the parameter value set, the new pre-emphasis parameter value may be determined as 8, which is the intermediate value between the minimum value and the maximum value.

In step S570, the memory controller 330 may store the new parameter value set in the register 370 and the memory device 150.

In step S590, the memory interface 350 may transfer a signal whose magnitude and waveform are determined based on the new parameter value set to the host 200. Also, since the memory controller 330 stores the new parameter value set in the memory device 150, when the memory system 300 is powered on again, the memory controller 330 may transfer a signal to the host 200 by using the new parameter value set. When the host 200 needs to change the new parameter value set, it may provide a signal tuning command again to the memory system 300. For example, when the host 200 changes to a different protocol option, the swing width of the output signal of the memory system 300 may change. Therefore, it is required to change the new parameter value set.

Figure 7:
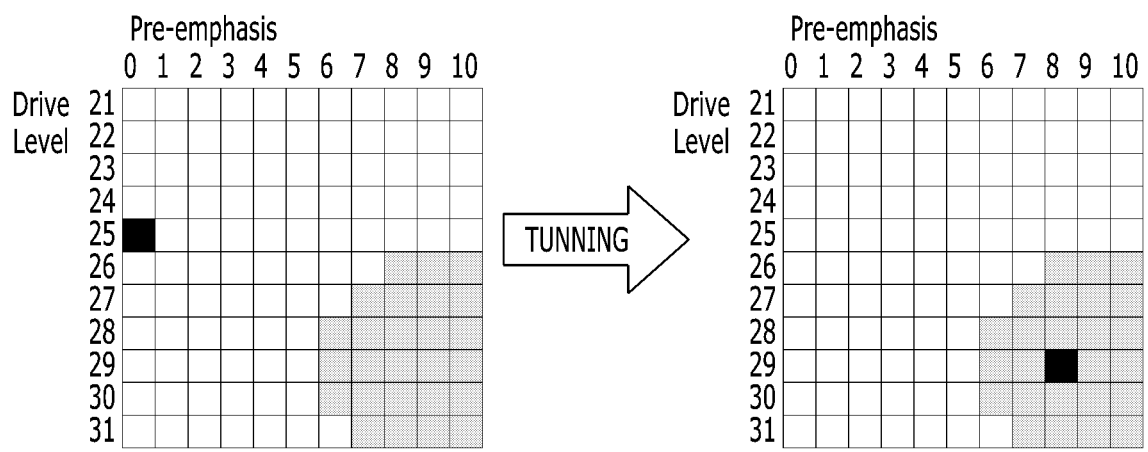
FIG. 7 is a graph describing an effect of an embodiment of the present invention.

FIG. 7 is a graph describing an effect of an embodiment of the present invention.

FIG. 7 illustrates that reliability of communication may be ensured when the values of the parameters are determined in consideration of the mounting environment of the memory system 300 in accordance with an embodiment of the present invention.

FIG. 7 illustrates an example of the results of a plurality of signal transmission operations of the memory system 300 in a bitmap form when the termination resistor is deactivated in a high voltage mode. The candidates of the pre-emphasis parameter value that the memory system 300 may have are shown in the horizontal direction of the bitmap of FIG. 7, and the candidates of the drive voltage parameter value that the memory system 300 may have are shown in the vertical direction of the bitmap of FIG. 7. The example of FIG. 7 illustrates a case where a signal transmission operation is performed by varying the pre-emphasis parameter value and the drive voltage parameter value.

The gray shaded portion may indicate a result showing that the host 200 received a normal signal, whereas the portion that is not shaded may indicate a result showing that the host 200 received an abnormal signal.

The portion shown in black in the left bitmap of FIG. 7 may represent a parameter value set stored in the register 370 before signal tuning is completed, for example, a default parameter value set that are set at the time of the fabrication of the memory system 300. In a signal transmission operation based on the default parameter value set, signals are not recognized as valid, because the default parameter value set is out of the range of candidates of the parameter value set in which signals are recognized as valid. As such, when a signal is provided to the host 200 by determining the magnitude and waveform of the signal in a default combination that does not consider the mounting environment of the memory system 300, the signal provided to the host 200 may not be recognized as valid.

The portion shown in black in the right bitmap of FIG. 7 may represent a new parameter value set stored in the register 370 after the signal tuning is completed. Since the new parameter value set is within the range of candidates of the parameter value set in which signals are validly recognized, when the memory physical layer 352 transfers an output signal to the host 200 according to the new parameter value set, signals may be validly recognized.

According to an embodiment of the present invention, the memory system 300 may optimize the waveform and magnitude of a signal provided to the host 200 to the mounting environment in response to a signal tuning command of the host 200. Therefore, the memory system 300 may transfer a validly recognized signal to the host 200 regardless of the mounting environment. Therefore, the reliability of the memory system 300 may be improved.

According to an embodiment of the present invention, the noise margin of a signal transferred from a memory system to a host may be sufficiently secured regardless of differences in the mounting environment of the memory system.

According to an embodiment of the present invention, even when communication is performed at a high speed between a host and a memory system, reliability may be secured for the signal transmission between the host and the memory system.

While the present invention has been illustrated and described with respect to the specific embodiments, it will be apparent to those skilled in the art that various changes and modifications may be made without departing from the spirit and scope of the invention as defined in the following claims. That is, the present invention encompasses all variations and modifications of any of the disclosed embodiments that fall within the scope of the claims.

What is claimed is:

1. A memory system, comprising:
   a memory device suitable for storing data;
   a controller suitable for controlling the memory device;
   an interface suitable for communication between a host and the controller;
   a register suitable for storing a parameter value set associated with a waveform and a magnitude of a signal provided by the interface to the host, wherein the controller is suitable for:

performing operations for candidates of the parameter value set, each of the operation includes:

controlling the interface to transfer a first signal, a magnitude and waveform of which are determined based on the candidate of the parameter value set, to the host, and receiving, from the host, a response indicating whether or not the first signal was recognized as valid at the host, storing a new parameter value set, which is determined based on the responses of the operations, in the register, and controlling the interface to transfer a new signal having adjusted waveform and magnitude to the host based on the new parameter value set, wherein the parameter value set includes a drive level parameter value and one or more emphasis parameter values, and wherein the one or more emphasis parameter values include a pre-emphasis parameter value and a de-emphasis parameter value.

2. The memory system of claim 1, wherein the controller is further suitable for determining, as the new parameter value set, an intermediate value set between a maximum value set and a minimum value set among the candidates of the parameter value set for which the first signal was recognized as valid.

3. The memory system of claim 1, wherein the controller repeatedly performs the operations in response to a signal tuning command from the host, and wherein the controller stores the new parameter value set in the register.

4. The memory system of claim 1, wherein the controller controls the interface to transfer the first signal, for each of multiple combinations of candidates of the drive level parameter value and candidates of the one or more emphasis parameter values, to the host, and wherein the controller stores in the register a new drive level parameter value and one or more new emphasis parameter value that are determined based on results of the operations for multiple combinations of the candidates of the drive level and the candidates of the one or more emphasis parameter values, as the new parameter value set.

5. The memory system of claim 4, wherein the controller is further suitable for determining, as the new drive level parameter value, an intermediate value between a maximum value and a minimum value among the candidates of the drive level parameter value included in combinations for which the first signal was recognized as valid, and wherein the controller is further suitable for determining, as the new emphasis parameter value, an intermediate value between a maximum value and a minimum value among the candidates of the one or more emphasis parameter values included in combinations for which the first signal was recognized as valid.

6. A method for operating a memory system, comprising:

performing, for candidates of a parameter value set, operations of:

transferring, to the host, a first signal, the magnitude and waveform of which are determined based on one among the candidates of the parameter value set, and receiving, from the host, a response indicating whether or not the first signal was recognized as valid at the host;

storing a new parameter value set, which is determined based on results of the operations, in the register; and transferring a new signal having adjusted waveform and magnitude to the host based on the new parameter value set, wherein the parameter value set includes a drive level parameter value and one or more emphasis parameter value, and wherein the one or more emphasis parameter values include a pre-emphasis parameter value and a de-emphasis parameter value.

7. The method of claim 6, further comprising determining, as the new parameter value set, an intermediate value set between a maximum value set and a minimum value set among the candidates of the parameter value set for which the first signal was recognized as valid.

8. The method of claim 6, wherein the operations are repeatedly performed in response to a signal tuning command from the host.

9. The method of claim 6, wherein the transferring includes:

transferring the first signal, for each of multiple combinations of candidates of the drive level parameter value and candidates of the one or more emphasis parameter values, to the host, wherein the storing includes storing, in the register, a new drive level parameter value and one or more new emphasis parameter values that are determined based on results of the operations for multiple combinations of the candidates of drive level and the candidates of the one or more emphasis parameter values, as the new parameter value set.

10. The method of claim 9, wherein the storing further includes:

determining, as the new drive level parameter value, an intermediate value between a maximum value and a minimum value among the candidates of the drive level parameter value included in combinations for which the first signal was recognized as valid, and determining, as the new emphasis parameter value, an intermediate value between a maximum value and a minimum value among the candidates of the one or more emphasis parameter values included in combinations for which the first signal was recognized as valid.

11. An operating method of a controller, the operating method comprising:

heuristically obtaining, by providing a first signal to an external device and receiving a response from the external device, one or more optimal sets of parameters for a communication signal; and communicating with the external device through the communication signal based on at least one of the one or more optimal sets of parameters to control a memory device to perform an operation, wherein the one or more optimal sets of parameters include a drive level parameter value and one or more emphasis parameter value, and wherein the one or more emphasis parameter values include a pre-emphasis parameter value and a de-emphasis parameter value.

* * * * *